United States Patent [19]

Rodgers

[11] Patent Number: 5,012,889

[45] Date of Patent: May 7, 1991

[54] SPEAKER ENCLOSURE

[75] Inventor: Howard Rodgers, Woodland Hills, Calif.

[73] Assignee: Rogersound Labs, Inc., Canoga Park, Calif.

[21] Appl. No.: 443,914

[22] Filed: Nov. 30, 1989

[51] Int. Cl.[5] .................. H05K 5/00

[52] U.S. Cl. .................. 181/152; 181/144; 181/156; 181/159; 181/199; 381/156

[58] Field of Search .................. 181/144, 152, 156, 159, 181/194, 199; 381/156

[56] References Cited

U.S. PATENT DOCUMENTS

| | | | |
|---|---|---|---|
| 2,205,804 | 6/1940 | Wells . | |
| 2,751,997 | 6/1956 | Gately, Jr. | 181/152 |
| 2,766,839 | 10/1956 | Baruch et al. . | |
| 3,112,006 | 11/1963 | Roberts | 181/156 |
| 3,186,509 | 6/1965 | Dudognon . | |
| 3,729,061 | 4/1973 | Kamura | 181/156 X |
| 3,892,288 | 7/1975 | Klayman et al. | 181/156 |
| 3,912,866 | 10/1975 | Fox | 181/155 X |
| 4,064,966 | 12/1977 | Burton | 181/144 |
| 4,122,302 | 10/1978 | Bobb | 181/145 X |
| 4,853,964 | 8/1989 | Weckler | 181/152 X |

*Primary Examiner*—Benjamin R. Fuller

*Attorney, Agent, or Firm*—Blakely, Sokoloff, Taylor & Zafman

[57] ABSTRACT

A loudspeaker enclosure accommodates at least one speaker in the front wall of the enclosure. The interior of the enclosure is divided into two smaller chambers by means of a partition inclined with respect to the front and rear walls. One such chamber is adjacent to the speaker, while the second or rear chamber is separated from the front chamber by the partition. Below the speaker is a vent or port in communication with the rear chamber. Sound waves emanating from the rear of the speaker are reflected by the inclined partition and reflected upwardly toward the top of the speaker enclosure. The partition does not extend to the top wall of the enclosure, thereby allowing sound waves to reflect off of the top wall and enter the rear chamber. The sound waves then exit the enclosure through the port below the speaker. The rear waves are thus delayed with respect to the front waves from the speaker to achieve the desired tuning of the speaker system. Furthermore, the arrangement of the interior partition causes the rear waves to be compressed at two locations thereby increasing the effective delay and further improving low frequency response.

25 Claims, 1 Drawing Sheet

SPEAKER ENCLOSURE

FIELD OF THE INVENTION

This invention relates to the field of loudspeaker systems, and more particularly to a high efficiency, extended bass speaker enclosure.

BACKGROUND ART

A bass loudspeaker, or woofer, radiates sound both in the forward and rearward directions. One of the purposes of a speaker enclosure is to prevent the cancellation effect of the rear wave of the woofer upon the waves radiated from the front by isolating the forward wave from the rearward wave. Several kinds of enclosures are known in the art:

(a) Infinite Baffle (Air Suspension): An air suspension enclosure is a completely sealed box in which the rear wave is prevented from cancelling the front wave. In addition, air trapped inside the sealed enclosure results in a springing effect which helps to stabilize the woofer cone. Since the resonant frequency of the enclosure determines the bass response, the smaller the enclosure, the higher the resulting resonant frequency. Air suspension designs are generally less efficient because the rear wave of the speaker is not being utilized to augment the low frequency output in any way.

(b) Bass Reflex: The bass reflex design utilizes a portion of the rear wave of the woofer to augment the front wave. A precisely determined hole (vent) in the enclosure or a port tube or other such device is provided through which the rear wave from the woofer is permitted to exit the enclosure. The vent is designed to delay the rear wave so that when it emerges at the front of the enclosure, it is in phase with the front wave at the frequency the designer wishes to reinforce. As a result of such reinforcement, the bass reflex design offers increased efficiency. However, a disadvantage of this design is that the frequency response falls off very rapidly when the speaker system is called upon to reproduce frequencies below its system resonance.

(c) Horn Enclosure: In this design, a horn acts as an acoustical transformer that matches the high mechanical impedance of the vibrating diaphragm to the relatively low acoustical impedance of the air at the large mouth of the horn. By virtue of this transformer action, the comparatively small area of the diaphragm finds it easy to "grab hold" of a large quantity of air by easy small steps through the gradually expanding cross sectional area of the horn through which the sound travels outward. Because of this effect, the horn provides more efficient coupling between the speaker enclosure and the air, and the efficiency of the horn enclosure is the highest of any known design. Horn enclosures may take many different shapes such as folded horns, corner horns, exponential horns, but the principles of operation are the same for all such shapes. A significant disadvantage of the horn design is that the length of the horn must be extremely long in order to obtain good bass response at low frequencies. This design is not practical in a compact speaker design, and no known expressions of this designs exist in compact form.

(d) Acoustical Labyrinth: This design channels the rear wave from the woofer through a folded passageway so that when the sound finally emerges it is delayed as much as possible and, therefore, reinforces the woofer at the lowest possible frequency. Like the horn enclosure, this design is not practical for compact speakers due to the length of the passage required.

In the design of commercially practical compact speaker enclosures, the two most viable designs are bass relex and air suspension. In both of those designs, in order to obtain a deeper bass response, with all other factors equal, a larger enclosure volume is required. Enclosure volume is determined by the height, width and depth of the box. The current trend in loudspeaker design is towards smaller speaker enclosures because they intrude less in a room. Furthermore, a deeper enclosure is generally more compatable with aesthetic considerations than is a wider or taller enclosure. However, with a deep enclosure, the quality of the bass suffers. This is caused by the excessive depth of the enclosure. The sound wave which emanates from the back of the woofer travels to the rear wall of the enclosure and is reflected back towards the woofer. Because of the increased depth, when the wave returns to the woofer, it is out of phase with the woofer at a lower frequency where it causes cancellation and degrades the speaker's response. The result, in non-technical terms can be called "boomy" or "muddy." In a speaker enclosure that has a smaller depth dimension, there is less of a distance to travel. Therefore, cancellation occurs at a higher frequency. Usually this frequency of cancellation is above the sound range that the woofer is asked to reproduce and no degradation in performance is observed.

Numerous variations on the basic speaker designs discussed above have been tried in an effort to improve speaker performance. For example, U.S. Pat. No. 4,064,966 describes a loudspeaker system in which a pair of speakers are arranged in back-to-back relationship on opposite sides of a sealed enclosure. One speaker faces the listener while the opposite speaker faces into an acoustic labyrinth adjoining the rear of the sealed enclosure. The path-length of the labyrinth is such that the phase of the rear facing speaker's output is reversed, and therefore reinforces the output of the front facing speaker at a desired frequency. In this system, a pair of speakers are required to achieve the desired augmentation. Furthermore, the acoustic labyrinth comprises parallel walls that create standing waves. Such standing waves have the effect of increasing the output at certain unwanted frequencies and diminishing other frequencies and, in addition, tend to minimize the effective volume of the enclosure.

U.S. Pat. No. 2,205,804 describes a cabinet for a loudspeaker in which the speaker is disposed in a partition that divides the cabinet into two chambers. Inclined reflectors in each chamber direct sound from the front and rear of the speaker towards openings in the respective chambers. This effectively increases the length of the air path between the front and rear of the speaker, thus decreasing cancellation of the front and back waves at low frequencies. In this design, both the front and rear waves from the speaker are directed into the interior of the cabinet, thereby reducing the overall efficiency of the speaker system. Furthermore, the length of the air path between the front and rear of the speaker is a direct function of the height of of the speaker cabinet, and thus a tall cabinet is required to improve low frequency response.

U.S. Pat. No. 2,766,839 describes a vented enclosure for a loudspeaker. The top wall of the speaker enclosure incorporates a plurality of vents or ports. An inclined partition is provided inside the enclosure also having a plurality of ports. The purpose of this partition is to minimize the amplitude of the upper resonance peak that is inherent in a ported enclosure design. Other approaches to improving the bass response of a loudspeaker system are described in U.S. Pat. Nos. 3,186,509; 3,912,866; 4,122,302 and 4,266,092.

The present invention represents an improvement over prior art loudspeaker systems such as those discussed above. One of the objects of the present invention is to provide a speaker system that yields a lower or deeper response from a given-sized enclosure over conventional methods of tuning. Another object of the present invention is the elimination of various unwanted side effects of conventional turning methods. For example, the loudspeaker enclosure described herein avoids the introduction of parallel surfaces inside the speaker enclosure. As discussed above, parallel walls cause standing waves which degrade the speaker's performance.

SUMMARY OF THE INVENTION

The present invention comprises a loudspeaker enclosure accommodating at least one speaker in the front wall of the enclosure. The interior of the enclosure is divided into two smaller chambers by means of a partition inclined with respect to the front and rear walls. One such chamber is adjacent to the speaker, while the second or rear chamber is separated from the front chamber by the partition. Below the speaker is a vent or port that allows the rear chamber to communicate with the environment outside of the enclosure.

Sound waves emanating from the rear of the speaker are reflected by the inclined partition and reflected upwardly toward the top of the speaker enclosure. The partition does not extend to the top wall of the enclosure, thereby allowing sound waves to reflect off of the top wall and enter the rear chamber. The sound waves then exist the enclosure through the port below the speaker. The rear waves are thus delayed with respect to the front waves from the speaker to achieve the desired tuning of the speaker system. Furthermore, the arrangement of the interior partition causes the rear waves to be compressed at two locations thereby increasing the effective delay and further improving low frequency response.

Speaker cabinet resonance or vibration is an unwanted effect in that it radiates unwanted sound from the actual enclosure itself. The design of the present invention substantially minimizes enclosure resonance in comparison to prior art designs by bracing the internal walls of the enclosure, thereby providing a clearer sound. Another advantage is that the enclosure is subdivided into two smaller chambers of unequal volume. Each of these chambers resonate at a different frequency. The amplitude of each of the resonance is lower than if there is only a single chamber within the enclosure.

DETAILED DESCRIPTION OF THE INVENTION

In the following description, for purposes of explanation and not limitation, specific numbers, dimensions, materials, etc. are set forth in order to provide a thorough understanding of the present invention. However, it will be apparent to one skilled in the art that the present invention may be practiced in other embodiments that depart from these specific details. In other instances, detailed descriptions of well-known speaker components are omitted so as not to obscure the description of the present invention with unnecessary detail.

Figure 1:
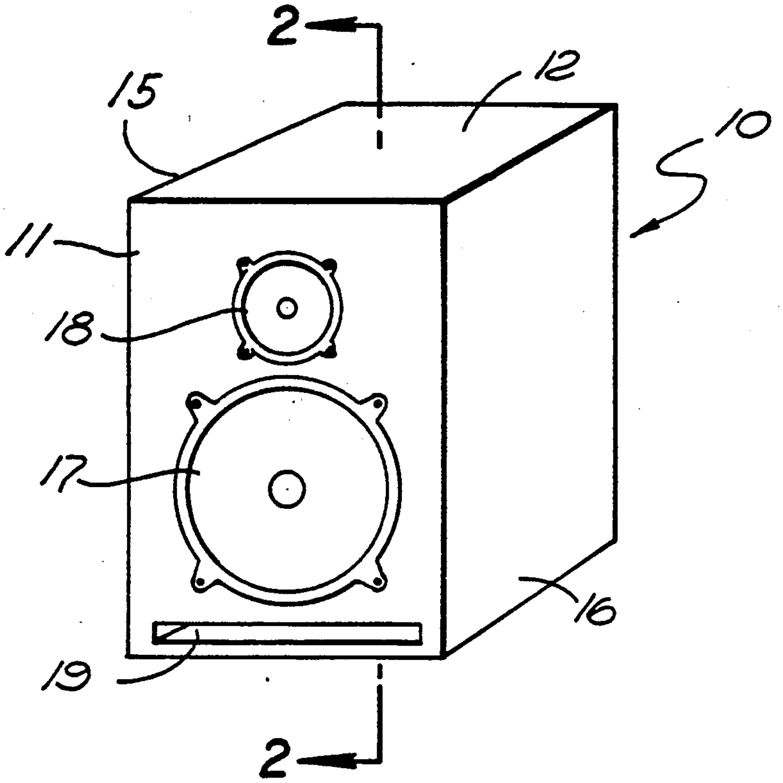
FIG. 1 is a perspective view of a loudspeaker system according to the present invention.
Figure 2:
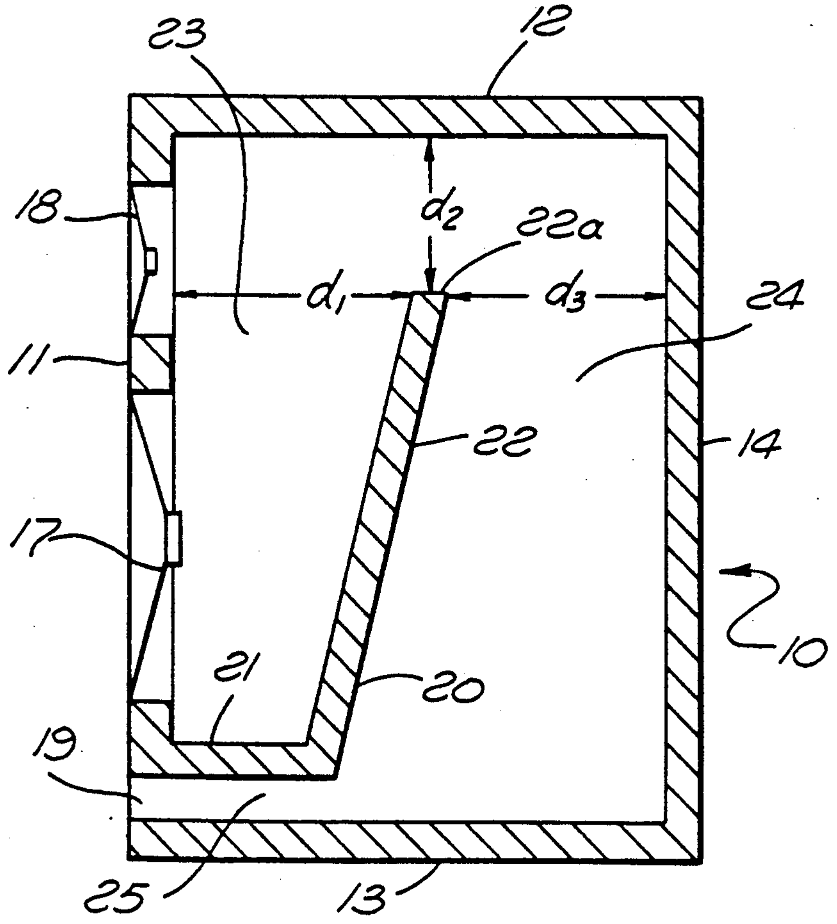
FIG. 2 is a cross-sectional view through line 2—2 of FIG. 1.

Referring to FIGS. 1 and 2, a loudspeaker enclosure according to the present invention is shown generally as 10. Enclosure 10 is a generally box-like structure having a front wall 11, a top wall 12, a bottom wall 13, a rear wall 14, and opposing side walls 15 and 16. Enclosure 10 may be constructed in a conventional manner from plywood, particle board or any other suitable material having acoustical properties appropriate for use in a loudspeaker enclosure generally.

Loudspeakers 17 and 18 are mounted in respective apertures in front wall 11. As is conventional in the construction of multi-speaker systems, loudspeaker 17 is designed to reproduce bass frequencies, whereas loudspeaker 18 is designed to reproduce frequencies in the mid-range and above. Separation of the frequency components radiated by loudspeakers 17 and 18 may be increased by use of a crossover network (not shown). Additional loudspeaker or other sound radiating devices may be incorporated in enclosure 10, either co-located on front wall 11 with loudspeaker 17 and 18 or disposed on one of the other walls of the enclosure. In particular, multiple bass loudspeakers may be employed in lieu of a single speaker as illustrated. A grill of fabric, foam or other suitable material may be secured to the outer surface of front wall 11 in order to provide a pleasing and decorative appearance.

Referring particularly to FIG. 2, enclosure 10 includes a partition 20 disposed therewithin. Partition 20 includes a shelf portion 21 that is generally horizontal and that abuts front wall 11 immediately below bass loudspeaker 17, terminating at top edge *22a*. Inclined portion 22 is contiguous with shelf portion 21 and extends upwardly and rearwardly therefrom behind bass loudspeaker 17. Both shelf portion 21 and inclined portion 22 extend the entire width of enclosure 10 between side walls 15 and 16. Shelf portion 21 and inclined portion 22 are secured to side walls 15 and 16 by fasteners, glue, or other suitable means so that the interior volume of enclosure 10 is acoustically separated into a first chamber 23 adjacent to bass loudspeaker 17 and a second chamber 24 between inclined portion 22 and rear wall 14. Shelf portion 21 is separated from bottom wall 13 by a narrow passage 25 which communicates with port 19. Port 19 comprises an aperture formed within front wall 11, or may be conveniently formed by terminating the lower portion of front wall 11 at shelf portion 21 so that a horizontal slot is formed adjacent to bottom wall 13 extending the entire width of enclosure 10 between side walls 15 and 16.

The specific dimensions of enclosure 10, together with the characteristics of the speaker or speakers mounted therein, will determine the acoustic performance of the loudspeaker system. In one embodiment of this invention, a nominal 6 inch diameter woofer 17 is mounted in an enclosure having outside measurements of approximately 13 inches in height, 11 inches in depth and 7.87 inches in width. The height of port 19 and passage 25 is approximately ⅜ inch. Shelf portion 21 extends rearwardly approximately 4.5 inches from the outer surface of front wall 11. Top edge *22a* of inclined portion 22 is in approximate alignment with the vertical centerline of enclosure 10 and is approximately 4 inches below the inner surface of top wall 12 (dimension $d_2$). In general, it has been found that superior performance is obtained when dimensions $d_1$, $d_2$, and $d_3$ are approximately equal, however, the present invention is not limited in this regard.

Sound waves radiating from the back of bass loudspeaker 17 are reflected by inclined portion 22 and travel upwardly within chamber 23 toward top wall 12. These sound waves are reflected by top wall 12 and travel downwardly behind inclined portion 22 in chamber 24. The sound waves then enter passage 25 and are allowed to exit enclosure 10 through port 19. Sound waves emanating from the back of bass loudspeaker 17 thus travel along a folded acoustic path within enclosure 10. Therefore, with respect to any point outside of enclosure 10, sound waves radiated from the back of bass loudspeaker 17 travel a longer path compared to conventional ported speaker designs, and thus augmentation with the design of the present invention occurs at a relatively lower frequency. Furthermore, since portion 22 is inclined with respect to front wall 11 and rear wall 14, standing waves within enclosure 10 are substantially eliminated, thereby increasing the effective volume of the enclosure and lowering the system resonance.

It should be observed that sound waves travelling from the rear surface of bass loudspeaker 17 to port 19 encounter one or more regions having decreasing cross-sectional areas where they are subject to compression. This is not meant to imply that the sound waves are compressed in the sense of decreasing their wavelength, and hence increasing their frequency. Rather, it is the reciprocating air masses in which the sound waves are propagated that are cyclically compressed and decompressed in the regions of decreasing cross sectional area. However, it is convenient to refer to this effect as compression of the sound waves. One such region where the rear sound waves are compressed is where the sound waves enter passage 25 from chamber 24. Acoustical resistance is created at this point. Such resistance further delays the sound waves, thereby further lowering the frequency at which the rear wave from loudspeaker 17 augments the front wave. This effect further enhances the low frequency bass response of the speaker system. Because of this effect, the design of the present invention is conveniently referred to as a Compression Guide. In designs where dimension $d_3$ is less than $d_1$ or $d_2$, or where $d_2$ is less than $d_1$, compression of the rear waves, and hence acoustical resistance, is also created as the sound waves travel around top edge *22a* of inclined portion 22.

Yet a further advantage of the present invention is the structural rigidity contributed by partition 20. Flexure of a speaker enclosure can produce secondary sound waves that cancel low frequency waves radiated by the speaker. In the present invention, however, partition 20 also serves to stiffen enclosure 10, thereby reducing flexure and preserving the low frequency performance of bass loudspeaker 17.

It will be recognized that partition 20 may have other shapes than that shown in FIG. 2. For example, instead of comprising two generally planar portions, portion 20 may comprise a single curved portion. Furthermore, additional partitions may be placed within enclosure 10 to further lengthen the acoustical path between the rear of speaker 17 and port 19. This is particularly advantageous in a "tower" type enclosure. Although port 19 is preferably located in front wall 11, the present invention is not limited in this regard, and thus the rear wave may be permitted to exit enclosure 10 at any one or more other suitable locations.

An embodiment of the present invention was constructed using an 8 inch diameter woofer in an enclosure having a volume of 18 liters. The woofer employed a 1½inch vioce coil, had a free air resonance of 37.5 Hz, a total Q factor of 0.24 and a $V$as of 58.8 liters. This system was first tested without an interior partition as a conventional bass-reflex speaker system. Low frequency performance was measured at a point midway between the woofer center and port with the microphone 8 inches from the front of the speaker. The 3 db bass roll-off was measured at 59.64 Hz. This test was repeated after installation of an interior partition as described herein. The 3 db bass roll-off decreased to 45.96 Hz.

It will be recognized that the above described invention may be embodied in other specific forms without departing from the spirit or essential characteristics of the disclosure. Thus, it is understood that the invention is not to be limited by the foregoing illustrative details, but rather is to be defined by the appended claims.

I claim:

1. A loudspeaker system comprising: a loudspeaker having front and rear surfaces for radiating sound waves;

an enclosure for said loudspeaker including a first wall having a first aperture therethrough for receiving the loudspeaker such that said front surface is external to said enclosure and said rear surface is internal to said enclosure, said enclosure having a second aperture therethrough; an at least partially inclined partition disposed within said enclosure defining a folded acoustic path between said rear surface of said loudspeaker and said second aperture, said folded acoustic path having a region of decreased cross-sectional area proximate to said second aperture.

2. The loudspeaker system of claim 1 wherein said second aperture is located in said first wall.

3. The loudspeaker system of claim 1 wherein said partition is at least partially inclined with respect to said first wall.

4. The loudspeaker system of claim 3 wherein said partition comprises a first generally horizontal portion abutting said first wall and a second inclined portion contiguous with said first portion.

5. A loudspeaker system comprising:

a loudspeaker having front and rear surfaces for radiating sound waves;

an enclosure for said loudspeaker including a front wall, a top wall, a bottom wall, a rear wall and a pair of side walls, said front wall having a first aperture therethrough for receiving the loudspeaker, said enclosure having a second aperture therethrough;

an at least partially inclined partition abutting said front wall below said first aperture and extending between said side walls dividing said enclosure into at least two acoustically coupled chambers, one such chamber associated with said first aperture, the other such chamber communicating with said second aperture through a region of decreased cross-sectional area.

6. The loudspeaker system of claim 5 wherein said second aperture is located in said front wall.

7. The loudspeaker system of claim 5 wherein said at least partially inclined partition divides said enclosure into a first chamber in which sound waves radiated from the rear surface of the loudspeaker are deflected upwardly towards said top wall and a second chamber in which sound waves reflected downardly by said top wall are directed towards said second aperture.

8. The loudspeaker system of claim 7 wherein said partition comprises a first generally horizontal portion abutting said front wall and a second inclined portion contiguous with said first portion.

9. The loudspeaker system of claim 8 wherein said first portion of said partition is disposed in a spaced apart relationship with said bottom wall so as to define a narrow acoustic passage coupled to said second chamber.

10. The loudspeaker system of claim 9 wherein said narrow acoustic passage terminates at said second aperture.

11. The loudspeaker system of claim 7 wherein said partition terminates at an upper edge approximately equidistant from said front, top and rear walls.

12. An enclosure for a loudspeaker comprising:

a front wall having a first aperture therethrough for receiving the loudspeaker;

a top wall, a bottom wall, a rear wall and a pair of side walls coupled to said front wall to form a generally box-like structure enclosing an interior volume, said box-like structure having a second aperture therethrough;

an at least partially inclined partition abutting said front wall below said first aperture and extending between said side walls, said partition disposed so as to define a folded acoustic path within said interior volume between said first and second apertures, said folded acoustic path having a region of decreased cross-sectional area proximate to said second aperture.

13. The enclosure of claim 11 wherein said second aperture is located through said front wall.

14. The enclosure of claim 11 wherein said partition comprises a first generally horizontal portion abutting said front wall and a second inclined portion contiguous with said first portion.

15. An enclosure for a loudspeaker having front and rear surfaces for radiating sound waves comprising:

a front wall having a first aperture therethrough for receiving the loudspeaker;

a top wall, a bottom wall, a rear wall and a pair of side walls coupled to said front wall to form a generally box-like structure enclosing an interior volume, said box-like structure having a second aperture therethrough;

an at least partially inclined partition abutting said front wall below said first aperture and extending between said side walls dividing said interior volume into at least two acoustically coupled chambers, one such chamber associated with said first aperture, the other such chamber communicating with said second aperture through a region of decreased cross-sectional area.

16. The enclosure of claim 15 wherein said second aperture is located through said front wall.

17. The enclosure of claim 15 wherein said at least partially inclined partition divides said interior volume into a first chamber in which sound waves radiated from the rear surface of the loudspeaker are deflected upwardly towards said top wall and a second chamber in which sound waves reflected by said top wall are directed towards said second aperture.

18. The enclosure of claim 17 wherein said partition comprises a first generally horizontal portion abutting said front wall and a second inclined portion contiguous with said first portion.

19. The loudspeaker system of claim 18 wherein said first portion of said partition is disposed in a spaced apart relationship with said bottom wall so as to define a narrow acoustic passage coupled to said second chamber.

20. The loudspeaker system of claim 19 wherein said narrow acoustic passage terminates at said second aperture.

21. The enclosure of claim 17 wherein said partition terminates at an upper edge approximately equidistant from said front, top and rear walls.

22. A loudspeaker system comprising:

at least one loudspeaker having front and rear surfaces for radiating sound waves;

an enclosure for said at least one loudspeaker including a first wall having a first aperture therethrough for receiving said at least one loudspeaker such that said front surface is external to said enclosure and said rear surface is internal to said enclosure, said enclosure having a second aperture therethrough; an at least partially inclined partition disposed within said enclosure defining a folded acoustic path between said rear surface of said at least one loudspeaker and said second aperture, said folded acoustic path having a region of decreased cross-sectional area proximate to said second aperture.

23. The loudspeaker system of claim 22 wherein said second aperture is located in said first wall.

24. The loudspeaker system of claim 22 wherein said partition is at least partially inclined with respect to said first wall.

25. The loudspeaker system of claim 24 wherein said partition comprises a first generally horizontal portion abutting said first wall and a second inclined portion contiguous with said first portion.

* * * * *

UNITED STATES PATENT AND TRADEMARK OFFICE

CERTIFICATE OF CORRECTION

PATENT NO. : 5,012,889

DATED : May 7, 1991

INVENTOR(S) : Rodgers

It is certified that error appears in the above-identified patent and that said Letters Patent is hereby corrected as shown below:

| | | |
|---|---|---|
| col. 03, line 14 | delete "turning" | insert --tuning-- |
| col. 03, line 38 | delete "exist" | insert --exit-- |
| col. 03, line 55 | delete "resonance" | insert --resonances-- |
| col. 04, line 27 | delete "loudspeaker" | insert --loudspeakers-- |
| col. 07, line 41 | delete "11" | insert --12-- |
| col. 07, line 43 | delete "11" | insert --12-- |

Signed and Sealed this

Seventh Day of December, 1993

*Attest:*

Bruce Lehman

BRUCE LEHMAN

*Attesting Officer*

*Commissioner of Patents and Trademarks*